(12) United States Patent
Xu et al.

(10) Patent No.: US 7,910,447 B1
(45) Date of Patent: Mar. 22, 2011

(54) SYSTEM AND METHOD FOR PROVIDING A SELF ALIGNED BIPOLAR TRANSISTOR USING A SIMPLIFIED SACRIFICIAL NITRIDE EMITTER

(75) Inventors: Mingwei Xu, South Portland, ME (US); Steven J. Adler, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 503 days.

(21) Appl. No.: 11/803,539

(22) Filed: May 15, 2007

(51) Int. Cl.
*H01L 21/8222* (2006.01)

(52) U.S. Cl. .................. 438/309; 257/E21.372

(58) Field of Classification Search .......... 438/309–378; 257/E21.372, E21.38
See application file for complete search history.

(56) References Cited

U.S. PATENT DOCUMENTS

| | | | | |
|---|---|---|---|---|
| 4,746,629 A | * | 5/1988 | Hanagasaki | 438/366 |
| 5,064,774 A | * | 11/1991 | Pfiester | 438/377 |
| 5,073,516 A | * | 12/1991 | Moslehi | 438/429 |
| 5,362,658 A | * | 11/1994 | Kuragaki | 438/320 |
| 5,767,004 A | * | 6/1998 | Balasubramanian et al. | 438/592 |
| 5,866,462 A | | 2/1999 | Tsai et al. | |
| 6,019,658 A | * | 2/2000 | Ludwig et al. | 445/50 |
| 6,043,554 A | | 3/2000 | Miwa | |
| 6,130,136 A | * | 10/2000 | Johnson et al. | 438/365 |
| 6,559,020 B1 | | 5/2003 | Salmi | |
| 6,740,552 B2 | | 5/2004 | Gonzalez et al. | |
| 6,780,695 B1 | | 8/2004 | Chen et al. | |
| 6,869,853 B1 | * | 3/2005 | Gopalan | 438/321 |
| 6,881,639 B2 | * | 4/2005 | Mochizuki et al. | 438/312 |
| 6,884,689 B2 | * | 4/2005 | Chuang et al. | 438/369 |
| 7,018,778 B1 | | 3/2006 | Leibiger et al. | |
| 7,291,536 B1 | * | 11/2007 | Kalburge et al. | 438/321 |
| 7,494,887 B1 | | 2/2009 | Hussain | |
| 2001/0017399 A1 | | 8/2001 | Oda et al. | |
| 2002/0013025 A1 | * | 1/2002 | Wylie | 438/235 |
| 2002/0153535 A1 | * | 10/2002 | Freeman et al. | 257/197 |
| 2003/0045066 A1 | | 3/2003 | Igarashi | |
| 2005/0062088 A1 | * | 3/2005 | Houston | 257/296 |
| 2005/0083577 A1 | * | 4/2005 | Varaprasad et al. | 359/604 |
| 2005/0142787 A1 | | 6/2005 | Ko | |
| 2005/0184359 A1 | | 8/2005 | Akatsu et al. | |
| 2005/0233536 A1 | * | 10/2005 | Bock et al. | 438/350 |
| 2006/0054595 A1 | | 3/2006 | Starzynski | |
| 2006/0113634 A1 | * | 6/2006 | Ahmed et al. | 257/565 |
| 2006/0231924 A1 | * | 10/2006 | Adam et al. | 257/565 |
| 2006/0249814 A1 | | 11/2006 | Greenberg et al. | |
| 2007/0001264 A1 | | 1/2007 | Sheridan et al. | |

OTHER PUBLICATIONS

Yousuke Yamamoto et al., "SDX: A Novel Self-Aligned Technique and Its Applicaiton to High-Speed Bipolar LSI's," IEEE Transactions on Electron Devices, vol. 35, No. 10, Oct. 1988, pp. 1601-1608.

(Continued)

*Primary Examiner* — Matthew W Such
*Assistant Examiner* — Ali Naraghi

(57) ABSTRACT

A system and method are disclosed for providing a self aligned bipolar transistor using a simplified sacrificial nitride emitter. An active region of a transistor is formed and a silicon nitride sacrificial emitter is formed above the active region of the transistor. Then a physical vapor deposition oxide layer is deposited over the silicon nitride sacrificial emitter using a physical vapor deposition process. The physical vapor deposition oxide layer is then etched away from the side walls of the sacrificial emitter. The sacrificial emitter is then etched away to form an emitter window. Then a polysilicon emitter structure is formed in the emitter window. The self aligned bipolar transistor architecture of the invention is compatible with BiCMOS technology.

20 Claims, 9 Drawing Sheets

OTHER PUBLICATIONS

Bengt Edholm et al., "A Self-Aligned Lateral Bipolar Transistor Realized on SIMOX-Material," IEEE Transactions on Electron Devices, vol. 40, No. 12, Dec. 1993, pp. 2359-2360.

Michihiro Inoue et al., "Self-Aligned Complementary Bipolar Transistors Fabricated with a Selective-Oxidation Mask," IEEE Transactions on Electron Devices, vol. ED-34, No. 10, Oct. 1987, pp. 2146-2152.

Yousuke Yamamoto et al., "SDX: A Novel Self-Aligned Technique and Its Application to High-Speed Bipolar LSI's," IEEE Transactions on Electron Devices, vol. 35, No. 10, Oct. 1988, pp. 1601-1608.

Bengt Edholm et al., "A Self-Aligned Lateral Bipolar Transistor Realized on SIMOX-Material," IEEE Transactions on Electron Devices, vol. 40, No. 12, Dec. 1993, pp. 2359-2360.

Michihiro Inoue et al., "Self-Aligned Complementary Bipolar Transistors Fabricated with a Selective-Oxidation Mask," IEEE Transactions on Electron Devices, vol. ED-34, No. 10, Oct. 1987, pp. 2146-2152.

P. Chevalier, et al., "230 GHz self-aligned SiGeC HBT for 90 nm BiCMOS technology", 2004 IEEE, p. 225-228.

S. Harrison, et al., "Poly-gate Replacement Through Contact Hole (PRETCH): A new method for High-K/Metal gate and multi-oxide implementation on chip," IEEE 2004, pp. 12.2.1-12.2.4.

* cited by examiner

SYSTEM AND METHOD FOR PROVIDING A SELF ALIGNED BIPOLAR TRANSISTOR USING A SIMPLIFIED SACRIFICIAL NITRIDE EMITTER

TECHNICAL FIELD OF THE INVENTION

The system and method of the present invention is generally directed to the manufacture of integrated circuits and, in particular, to a system and method for providing a self aligned bipolar transistor using a simplified sacrificial nitride emitter.

BACKGROUND OF THE INVENTION

Self aligned architectures in bipolar transistors are advantageous is that they provide better window downscaling and lower levels of parasitic capacitances and parasitic resistances. One commonly used prior art method of manufacturing self aligned bipolar transistors involves the use of a sacrificial nitride emitter. Chemical mechanical polishing (CMP) processes are often required to planarize the top of the sacrificial nitride emitter. For example, consider the prior art method for manufacturing a bipolar transistor shown in FIG. 1 and in FIG. 2.

FIG. 1 illustrates a schematic diagram 100 of a cross section of an intermediate structure formed during the manufacture of a prior art bipolar transistor showing a thick dielectric layer placed over a sacrificial nitride emitter. The intermediate structure shown in FIG. 1 comprises a Non-Selective Epitaxial Growth (NSEG) collector 110 and a selective implanted collector (SIC) 120 located within a central portion of the NSEG collector 110. The central portion of the NSEG collector 110 is located between two shallow trench isolation (STI) structures 130. As shown in FIG. 1, a layer of Non-Selective Epitaxial Growth (NSEG) base material 140 is placed over the NSEG collector 110 and over the STI structures 130.

Then a layer of a silicon oxide material 150 is placed over the NSEG base 140. Then a layer of silicon nitride 160 is placed over the silicon oxide material 150 to form a sacrificial nitride emitter. Then non-central portions of the layer of silicon nitride 160 are removed. Portions of the silicon oxide material 150 that are not located under the central portion of the silicon nitride 160 are also removed. The resulting structure of the silicon oxide material 150 and the resulting structure of the silicon nitride 160 are shown in FIG. 1.

Then a layer of silicon/polysilicon 170 is placed over the NSEG base material 140. Then a relatively thick layer of oxide (e.g. tetraethyloxysilane) 180 is placed over the silicon nitride 160 and over the silicon/polysilicon layer 170.

Then a chemical mechanical polishing (CMP) procedure is applied to expose the top of the sacrificial nitride emitter 160. FIG. 2 illustrates a schematic diagram 200 of a cross section of the intermediate structure 100 shown in FIG. 1 following the application of the chemical mechanical polishing (CMP) procedure. The chemical mechanical polishing (CMP) procedure has removed the portions of the oxide layer 180 from the top of the sacrificial nitride emitter 160. The exposed top of the sacrificial nitride emitter 160 is designated with reference numeral 210 in FIG. 2.

The required prior art step of applying a chemical mechanical polishing (CMP) procedure imposes a high level of process complexity in the manufacture of bipolar transistors. The required prior art step of applying a chemical mechanical polishing (CMP) procedure also limits the reproducibility of the process for more advanced emitter geometry.

When this type of self aligned architecture for a bipolar transistor (that requires the use of a CMP procedure) is integrated into a Bipolar-Complementary Metal Oxide Semiconductor (BiCMOS) technology, the CMP step presents a major problem for compatibility. This is due to the fact that using the CMP step requires precise control in order to avoid damaging the CMOS polysilicon gate region.

Therefore, there is a need in the art for a system and method that is capable of solving the problems that occur when such prior art methods are utilized. In particular, there is a need in the art for a system and method for providing an efficient process that is capable of manufacturing a self aligned bipolar transistor using a simplified sacrificial nitride emitter.

The method of the present invention solves the problems that are associated with the prior art by providing a self aligned bipolar transistor using a simplified sacrificial nitride emitter. An active region of a transistor is formed and a silicon nitride sacrificial emitter is formed above the active region of the transistor. Then a physical vapor deposition oxide layer is deposited over the silicon nitride sacrificial emitter using a physical vapor deposition process. The physical vapor deposition oxide layer is then etched away from the side walls of the sacrificial emitter. The sacrificial emitter is then etched away to form an emitter window. Then a polysilicon emitter structure is formed in the emitter window. The self aligned bipolar transistor architecture of the invention is completely compatible with BiCMOS technology.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
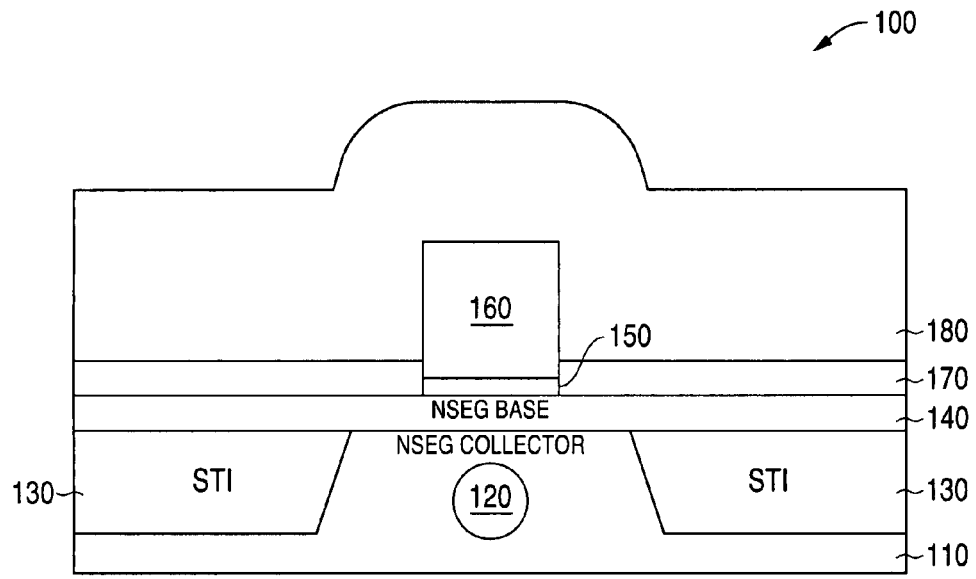
FIG. 1 illustrates a schematic diagram of a cross section of an intermediate structure formed during the manufacture of a prior art bipolar transistor showing a thick dielectric layer placed over a sacrificial nitride emitter.
Figure 2:
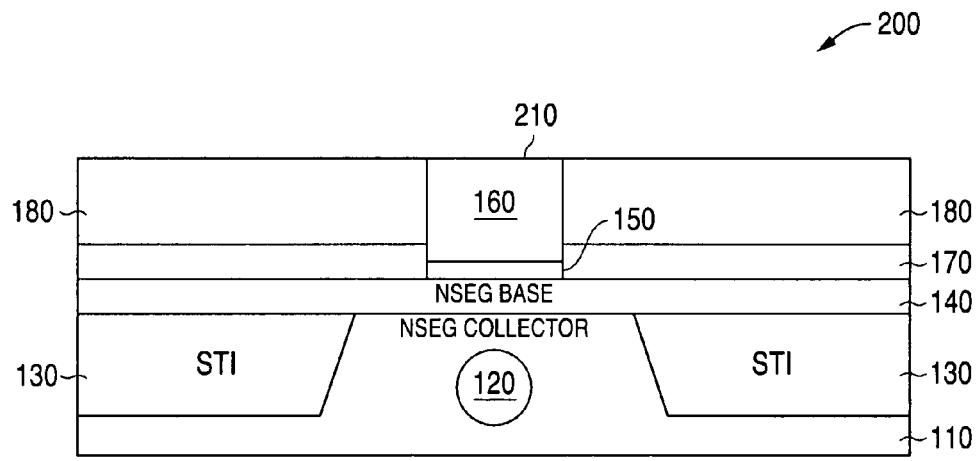
FIG. 2 illustrates a schematic diagram of a cross section of the intermediate structure shown in FIG. 1 following the application of chemical mechanical polishing (CMP) to expose the top of the sacrificial nitride emitter.

FIGS. 3 through 21, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

FIGS. 3 through 15 illustrate successive steps in the formation of a first embodiment of a self aligned bipolar transistor of the present invention using a simplified sacrificial nitride emitter. To simplify the drawings the reference numerals from previous drawings will sometimes not be repeated for structures that have already been identified. For purposes of clarity of illustration the thickness of the structures will sometimes not be drawn to scale.

Figure 3:
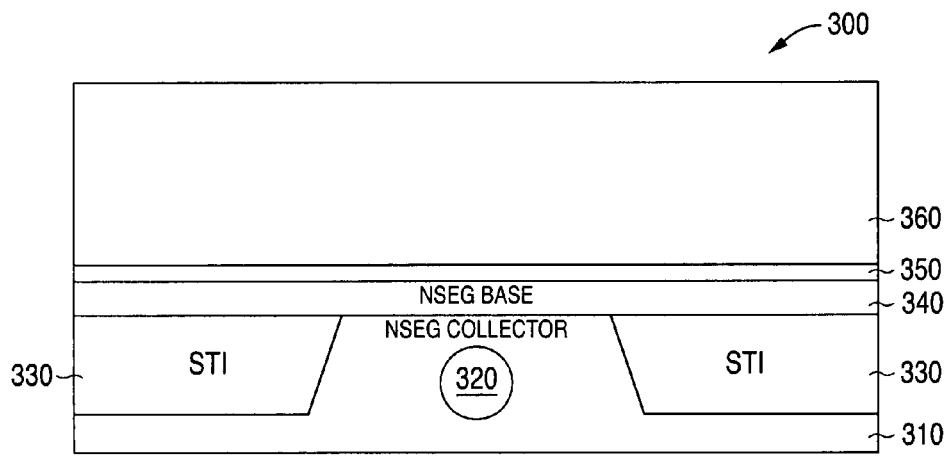
FIGS. 3 through 15 illustrate successive steps in the formation of a first embodiment of a self aligned bipolar transistor of the present invention using a simplified sacrificial nitride emitter.

The structure 300 shown in FIG. 3 comprises a Non-Selective Epitaxial Growth (NSEG) collector 310 and a selective implanted collector (SIC) 320 located within a central portion of the NSEG collector 310. The central portion of the NSEG collector 310 is located between two shallow trench isolation (STI) structures 330. As shown in FIG. 3, a layer of Non-Selective Epitaxial Growth (NSEG) base material 340 is placed over the NSEG collector 310 and over the STI structures 330.

Then a layer of a silicon oxide material 350 is placed over the NSEG base 340. In one advantageous embodiment of the invention, the silicon oxide material 350 comprises a layer of oxide (e.g., tetraethyloxysilane) that is approximately twenty nanometers (20 nm) thick. Then a layer of silicon nitride 360 is placed over the silicon oxide material 350 to form a sacrificial nitride emitter. In one advantageous embodiment of the invention, the layer of silicon nitride 360 is approximately two hundred fifty nanometers (250 nm) thick.

Then non-central portions of the layer of silicon nitride 360 are removed. Portions of the silicon oxide material 350 that are not located under the central portion of the silicon nitride 360 are also removed. The resulting structure of the silicon oxide material 350 and the resulting structure of the silicon nitride 360 are shown in the structure 400 shown in FIG. 4.

Then a layer of in-situ silicon/polysilicon 510 is selectively grown over the NSEG base material 340. In one advantageous embodiment of the invention, the thickness of the silicon/polysilicon layer 510 is approximately thirty nanometers (30 nm). The result of growing the silicon/polysilicon layer 510 is shown in the structure 500 shown in FIG. 5. For clarity the label "NSEG Base" for NSEG Base layer 340 and the label "NSEG Collector" for the NSEG Collector 310 will now be omitted from the drawings.

Then a layer of oxide 610 is placed over the silicon nitride emitter 360 and over the silicon/polysilicon layer 510 using a physical vapor deposition (PVD) process. An advantage of the PVD process is that it is anisotropic. In one advantageous embodiment of the invention, the thickness of the oxide layer 610 is approximately one hundred fifty nanometers (150 nm) thick and the thickness of the oxide layer 610 on the side walls of the silicon nitride emitter 360 is at most fifteen nanometers (15 nm) thick. In theory, the thickness of the oxide layer 610 on the side walls of the silicon nitride emitter 360 can be zero nanometers (0 nm) thick. The result of depositing the oxide layer 610 is shown in the structure 600 shown in FIG. 6. The thickness of the portions of the oxide layer 610 on the side walls of the silicon nitride emitter 360 is not drawn to scale.

Then an isotropic wet etch process is applied to etch away the portions of the oxide layer 610 that cover the side walls of the silicon nitride emitter 360. The result of etching away those portions of the oxide layer 610 is shown in the structure 700 shown in FIG. 7.

Figure 7:
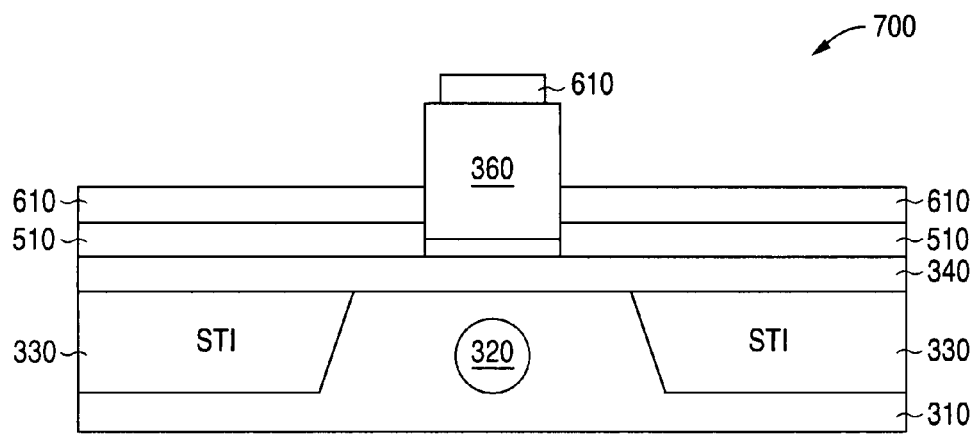
Figure 8:
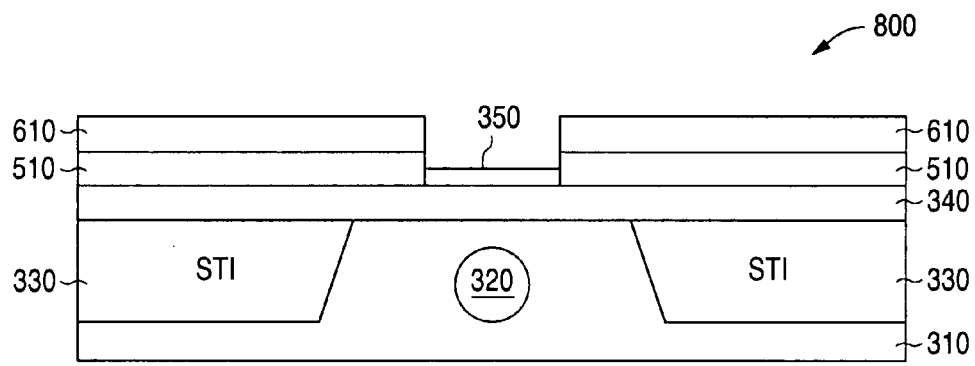
Figure 9:
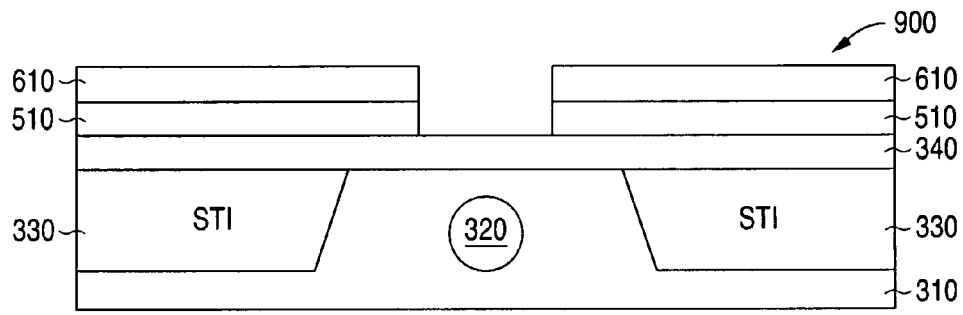
Figure 10:
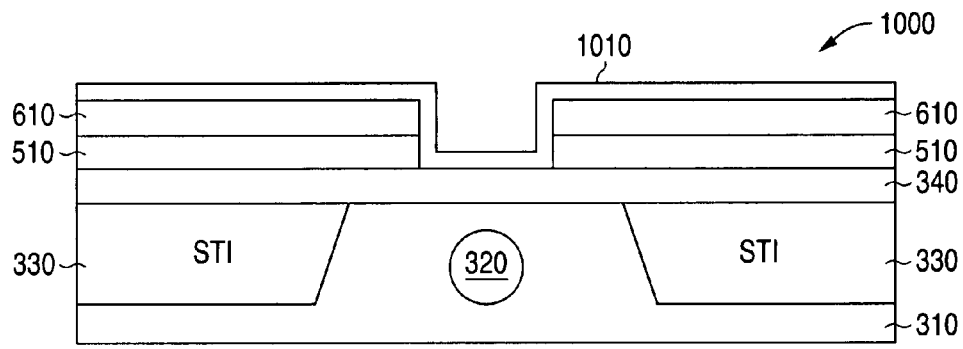
Figure 11:
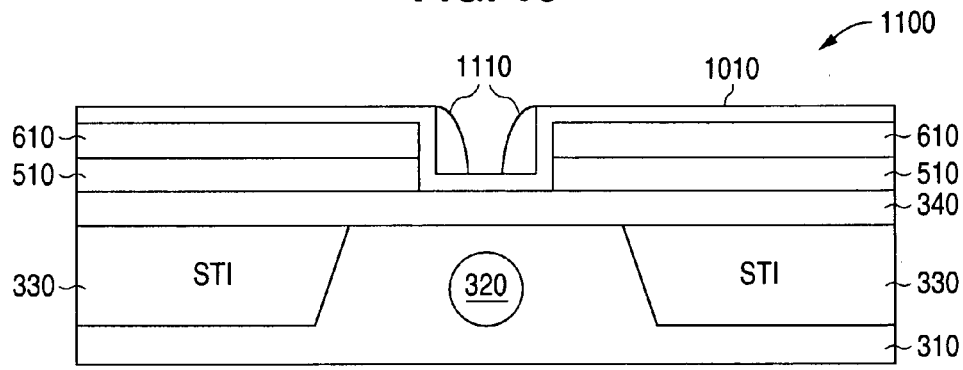
Figure 12:
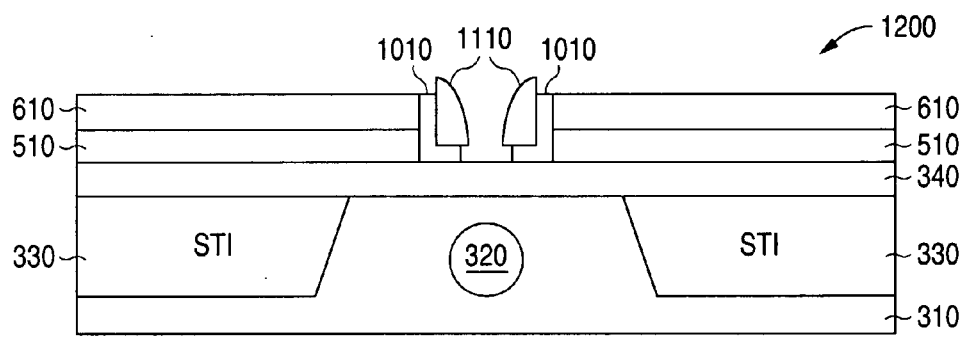

Then a hot phosphoric acid ($H_3PO_4$) wet etch process is applied to etch away all portions of the sacrificial silicon nitride emitter 360. The portion of the oxide layer 610 that remained on top of the sacrificial silicon nitride emitter 360 (as shown in FIG. 7) is also removed during the process. The hot phosphoric acid ($H_3PO_4$) wet etch process removes the sacrificial silicon nitride emitter 360 to open the emitter window. The silicon oxide 350 remains at the bottom of the emitter window. The result of etching away the sacrificial silicon nitride emitter 360 is shown in the structure 800 shown in FIG. 8.

Then a diluted hydrofluoric acid (HF) etch process is applied to etch away all portions of the silicon oxide material 350. The silicon oxide material 350 is thus removed from the emitter window. The result of etching away the silicon oxide material 350 is shown in the structure 900 shown in FIG. 9.

Then a layer of oxide 1010 (e.g., tetraethyloxysilane) is deposited to form a spacer layer. The oxide layer 1010 is deposited over the oxide layer 610 and over the NSEG base material 340 at the bottom of the emitter window. In one advantageous embodiment of the present invention the thickness of the oxide layer 1010 is approximately twenty nanometers (20 nm). The result of depositing the oxide layer 1010 is shown in the structure 1000 shown in FIG. 10.

Then a polysilicon spacer 1110 is formed along each side wall of the emitter window. In one advantageous embodiment of the present invention a thickness of the polysilicon spacer 1110 is approximately one hundred nanometers (100 nm). The polysilicon material is dry etched to form two polysilicon spacers 1110. The bottom of each polysilicon spacer sits on the oxide spacer layer 1010 that covers the NSEG base material 340 at the bottom of the emitter window. The result of forming the polysilicon spacers 1110 along the side walls of the emitter window is shown in the structure 1100 shown in FIG. 11.

Then a diluted hydrofluoric acid (HF) etch process is applied to etch away portions of the oxide spacer layer 1010 at the bottom of the emitter window that are not covered by the silicon spacers 1110. The portions of the oxide spacer layer 1010 that are removed from the bottom of the emitter window expose the underlying NSEG base material 340. The result of etching away the portions of the oxide spacer layer 1010 is shown in the structure 1200 shown in FIG. 12.

Figure 13:
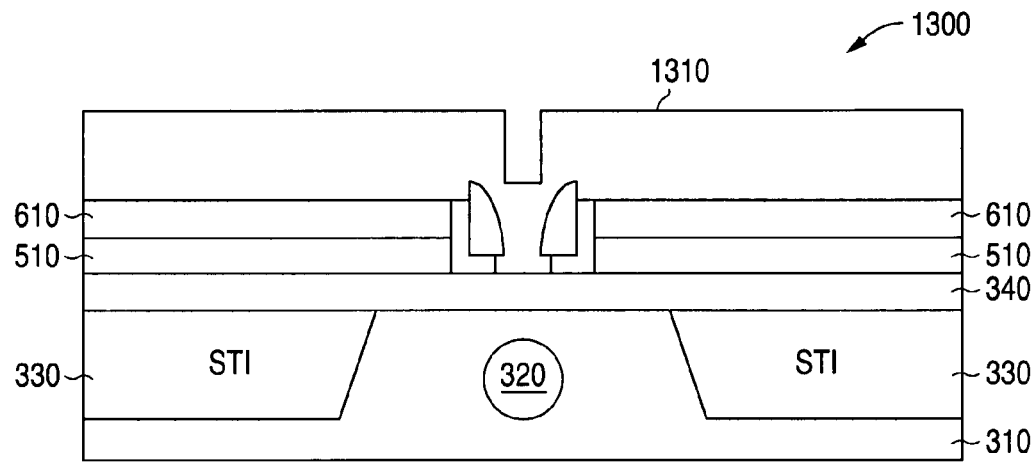
Figure 14:
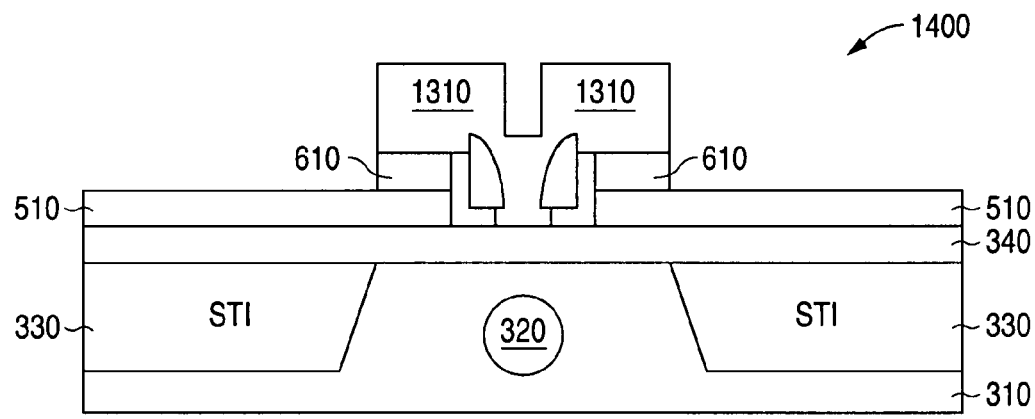
Figure 15:
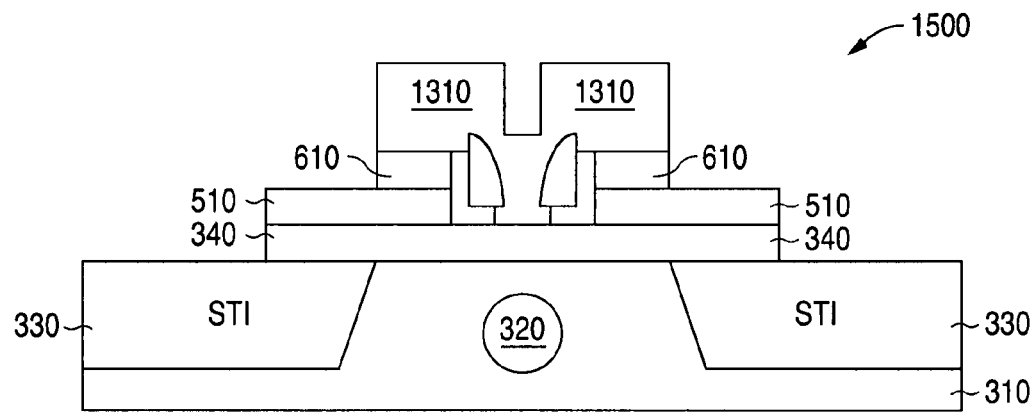

Then a polysilicon layer 1310 is deposited to form a polysilicon emitter layer. The material of the polysilicon layer 1310 fills the emitter window as shown in FIG. 13. In one advantageous embodiment of the present invention the thickness of the polysilicon layer is approximately two hundred nanometers (200 nm). The result of depositing the polysilicon layer 1310 is shown in the structure 1300 shown in FIG. 13.

Then a mask (not shown) is placed over a central portion of the polysilicon layer 1310. An etch procedure is then performed to etch away portions of the polysilicon layer 1310 that are not located under the mask. The etch procedure also etches away portions of the oxide layer 610 that are not located under the mask. The etch procedure stops on the silicon/polysilicon layer 510. The result of applying the etch procedure is shown in the structure 1400 shown in FIG. 14.

Then a polybase mask (not shown) is placed over a central portion of the polysilicon layer 1310 and over portions of the silicon/polysilicon layer 510 that are adjacent to the emitter window. An etch procedure is then performed to etch away portions of the silicon/polysilicon layer 510 that are not located under the polybase mask. The etch procedure also etches away portions of the NSEG base 340 that are not located under the polybase mask. The etch procedure stops on the shallow trench isolation (STI) structures 330. The result of applying the etch procedure is shown in the structure 1500 shown in FIG. 15.

The structure 1500 represents a self aligned architecture for a bipolar transistor that employs a sacrificial nitride emitter without using a Chemical Mechanical Polishing (CMP) procedure. The method of the present invention makes use of the anisotropic properties of the Physical Vapor Deposition (PVD) oxide deposition process and the isotropic properties of the oxide wet etch process. Using the method of the present invention it is possible to open and remove the sacrificial silicon nitride material without using a Chemical Mechanical Polishing (CMP) step. The method of the present invention significantly reduces process complexity and improves the compatibility of self aligned bipolar transistor architecture with BiCMOS technology.

Figure 16:
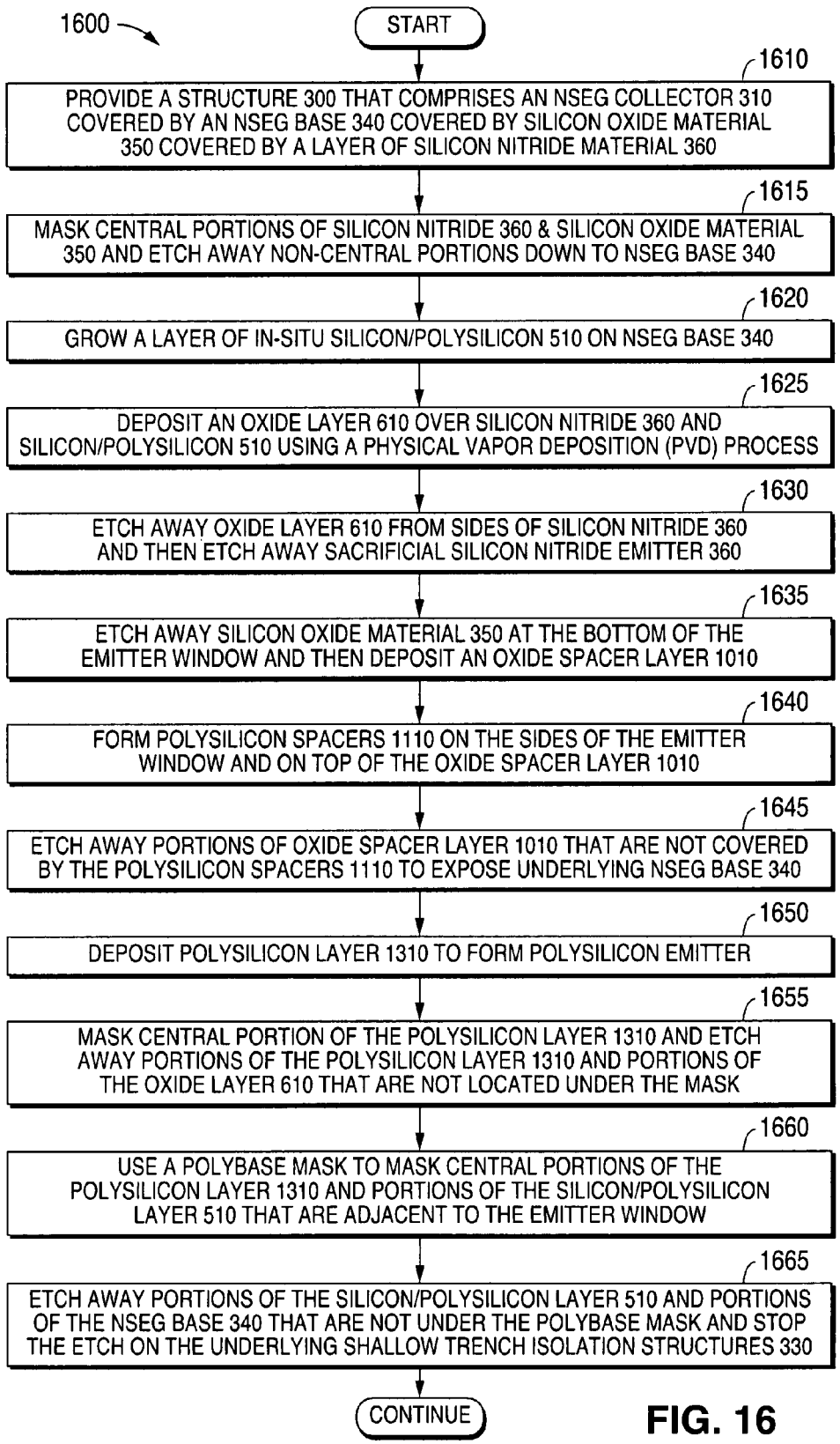
FIG. 16 illustrates a flow chart showing the steps of a first embodiment of a method of the present invention.

FIG. 16 illustrates a flow chart 1600 showing the steps of a first embodiment of a method of the present invention. In the first step of the method a structure 300 is provided that comprises an NSEG collector 310 covered by an NSEG base 340 covered by silicon oxide material 350 covered by a layer of silicon nitride material 360 (step 1610). Then central portions of the silicon nitride material 360 and the silicon oxide material 350 are masked and the non-central portions not under the mask are etched away down to the NSEG base 340 (step 1615).

Then a layer of in-situ silicon/polysilicon is selectively grown on the NSEG base 340 (step 1620). Then an oxide layer 610 is deposited over the silicon nitride 360 and over the silicon/polysilicon 350 using a Physical Vapor Deposition (PVD) process (step 1625). Then the oxide layer 610 is etched away from the sides of the silicon nitride 360 and then the sacrificial silicon nitride emitter 360 is etched away (step 1630).

Then the silicon oxide material 350 at the bottom of the emitter window is etched away and an oxide spacer layer 1010 is deposited (step 1635). Then polysilicon spacers 1110 are formed on the sides of the emitter window and on top of the oxide spacer layer 1010 (step 1640). Then portions of the oxide spacer layer 1010 that are not covered by the silicon spacers 1110 are etched away to expose the underlying NSEG base 340 (step 1645). Then a polysilicon layer 1310 is deposited to form a polysilicon emitter (step 1650). Then the central portion of the polysilicon layer 1310 is masked and the portions of the polysilicon layer 1310 and the portions of the oxide layer 610 that are not under the mask are etched away (step 1655).

Then a polybase mask is used to mask central portions of the polysilicon layer 1310 and portions of the silicon/polysilicon layer 510 that are adjacent to the emitter window (step 1660). Then portions of the silicon/polysilicon layer 510 and portions of the NSEG base 340 that are not under the polybase mask are etched away. The etch process stops on the underlying shallow trench isolation (STI) structures 330 (step 1665).

FIGS. 17 through 20 illustrate successive steps in the formation of a second embodiment of a self aligned bipolar transistor of the present invention using a simplified sacrificial nitride emitter. To simplify the drawings the reference numerals from previous drawings will sometimes not be repeated for structures that have already been identified.

The second embodiment of the self aligned bipolar transistor of the present invention does not employ the selective growth of an extrinsic base (i.e., silicon/polysilicon layer 510) of the type described in the first embodiment of the invention.

Figure 4:
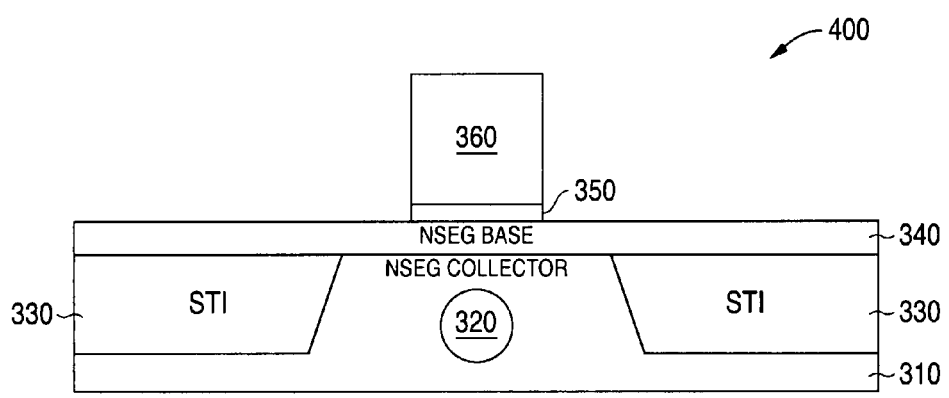
Figure 5:
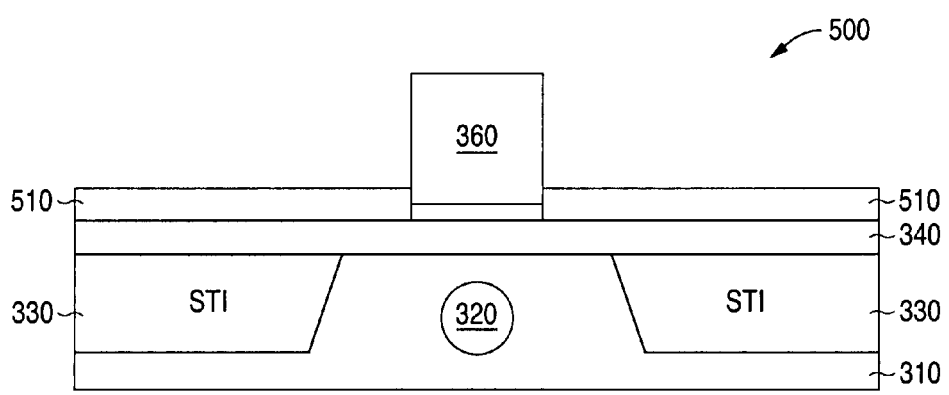
Figure 6:
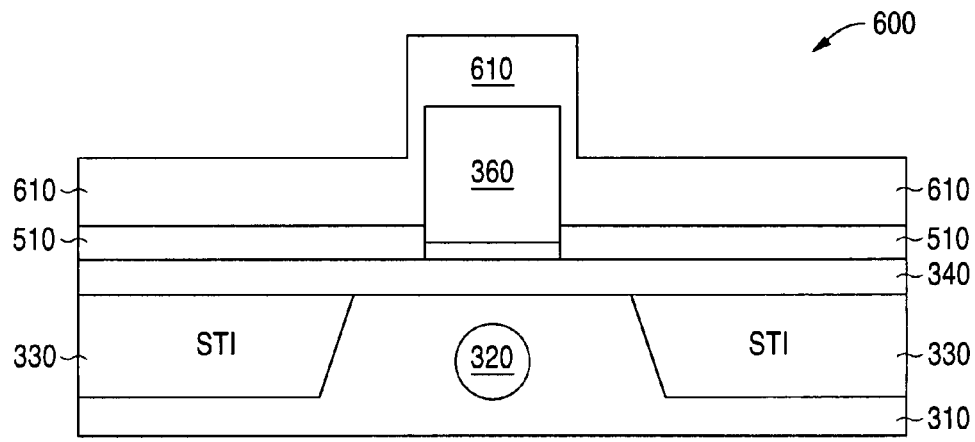
Figure 17:
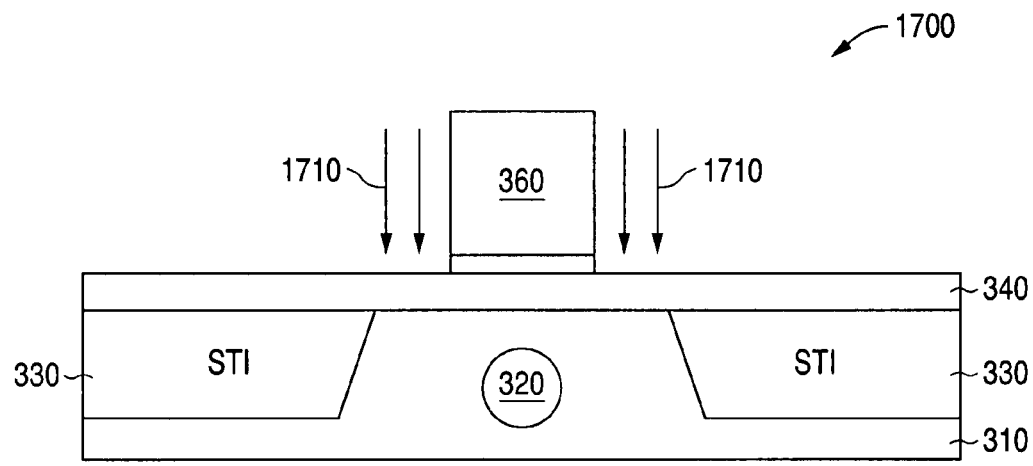
FIGS. 17 through 20 illustrate successive key steps in the formation of a second embodiment of a self aligned bipolar transistor of the present invention using a simplified sacrificial nitride emitter.
Figure 18:
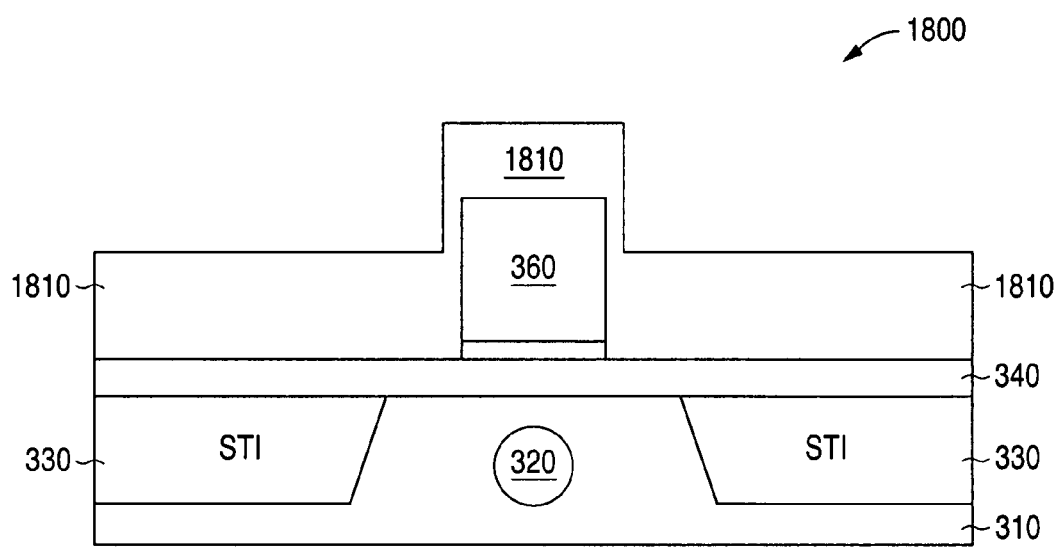

The first steps in the method of the second embodiment are the same as the first steps in the method of the first embodiment up to the structure that is shown in FIG. 4. That is, the first steps in the method of the second embodiment also produce the structure that is shown in FIG. 4. Then, instead of selectively growing an extrinsic base (such as silicon/polysilicon layer 510), the next step of the method of the second embodiment employs an external base implantation process. The external base implantation process is represented in FIG. 17 by arrows designated with reference numerals 1710. The external base implantation process is self aligned with the silicon nitride emitter 360 because there is no raised extrinsic base.

Then a layer of oxide 1810 is placed over the silicon nitride emitter 360 and over the implanted external base 340 using a physical vapor deposition (PVD) process. An advantage of the PVD process is that it is anisotropic. In one advantageous embodiment of the invention, the thickness of the oxide layer 1810 is approximately one hundred fifty nanometers (150 nm) thick and the thickness of the oxide layer 1810 on the side walls of the silicon nitride emitter 360 is at most fifteen nanometers (15 nm) thick. The result of depositing the oxide layer 1810 is shown in the structure 1800 shown in FIG. 18. The thickness of the portions of the oxide layer 1810 on the side walls of the silicon nitride emitter 360 is not drawn to scale.

Then an isotropic wet etch process is applied to etch away the portions of the oxide layer 1810 that cover the side walls of the silicon nitride emitter 360. The result of etching away those portions of the oxide layer 1810 is shown in the structure 1900 shown in FIG. 19.

Figure 19:
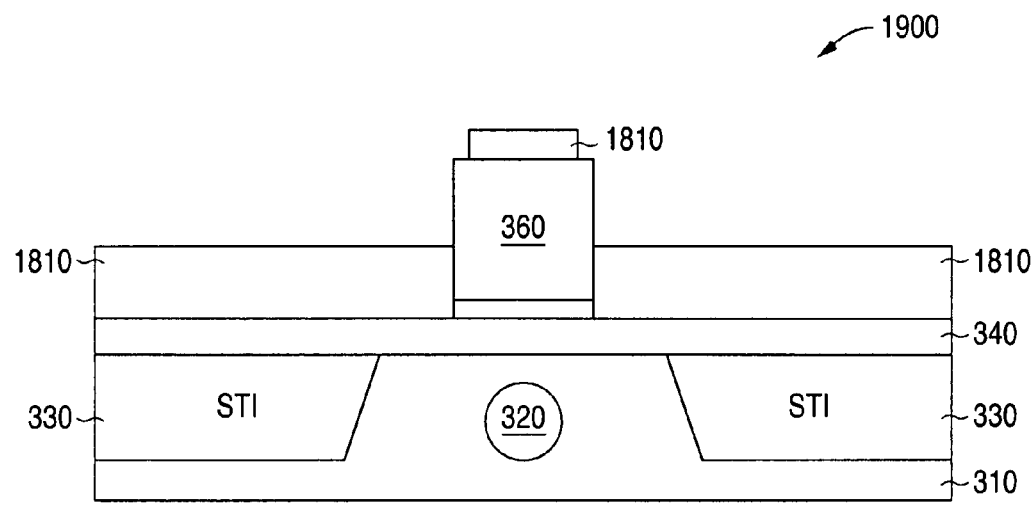
Figure 20:
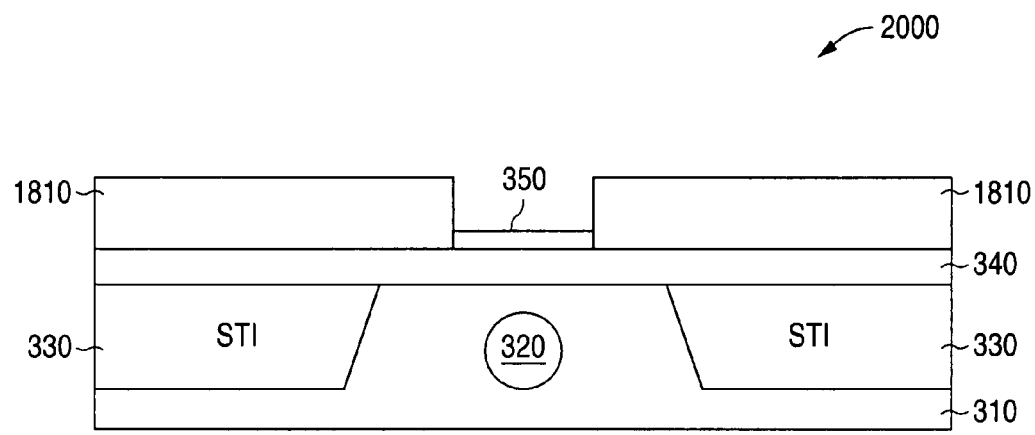

Then a hot phosphoric acid ($H_3PO_4$) wet etch process is applied to etch away all portions of the sacrificial silicon nitride emitter 360. The portion of the oxide layer 1810 that remained on top of the sacrificial silicon nitride emitter 360 (as shown in FIG. 19) is also removed during the process. The hot phosphoric acid ($H_3PO_4$) wet etch process removes the sacrificial silicon nitride emitter 360 to open the emitter window. The silicon oxide material 350 remains at the bottom of the emitter window. The result of etching away the sacrificial silicon nitride emitter 360 is shown in the structure 2000 shown in FIG. 20.

From this point the remaining steps in the method of the second embodiment are the same as the steps in the method of the first embodiment (except that there is no silicon/polysilicon layer 510 in the second embodiment). The method of the second embodiment of the invention produces a self aligned bipolar transistor that does not selectively grow an extrinsic base.

Figure 21:
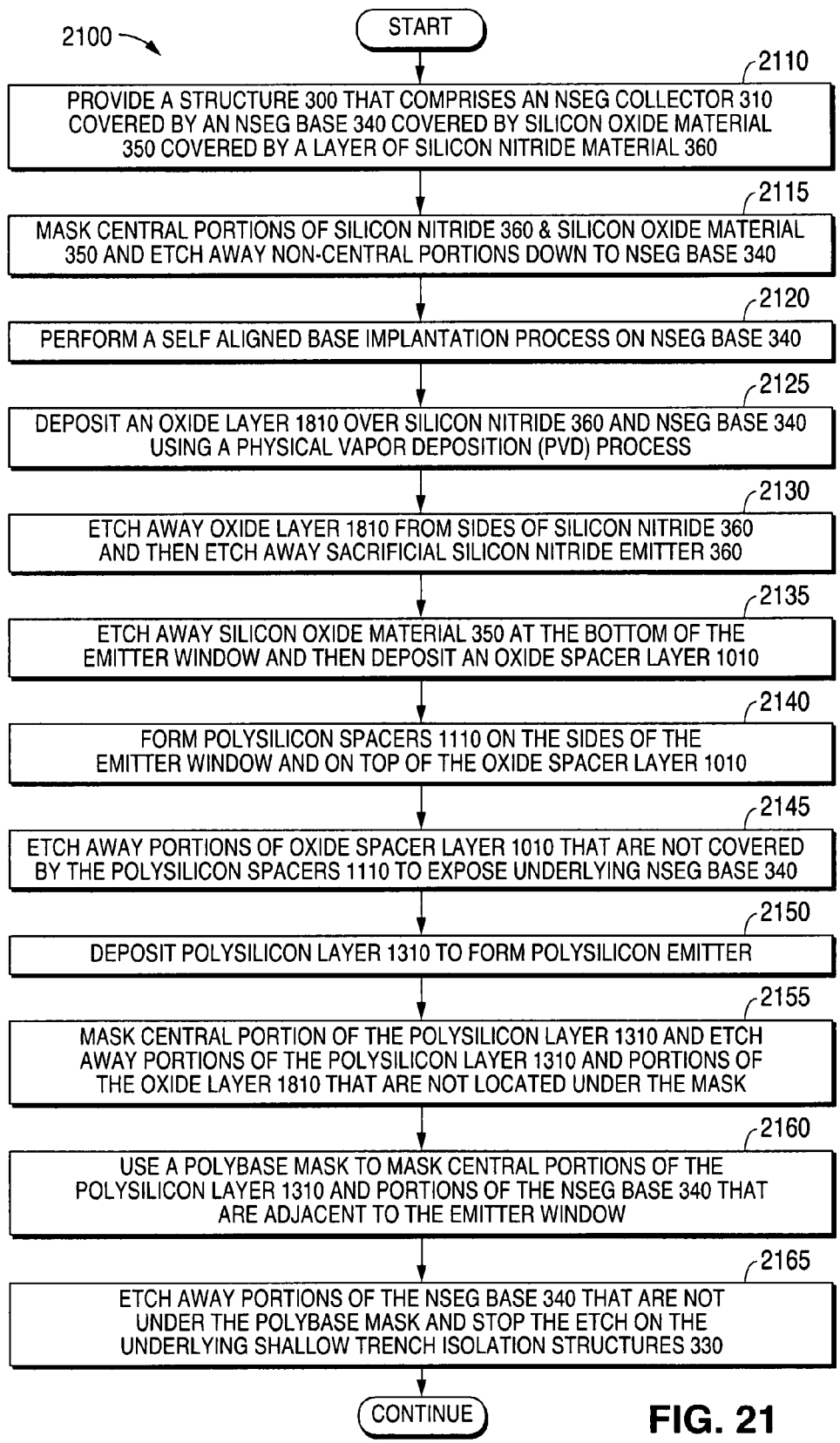
FIG. 21 illustrates a flow chart showing the steps of a second embodiment of a method of the present invention.

FIG. 21 illustrates a flow chart 2100 showing the steps of a second embodiment of a method of the present invention. In the first step of the method a structure 300 is provided that comprises an NSEG collector 310 covered by an NSEG base 340 covered by silicon oxide material 350 covered by a layer of silicon nitride material 360 (step 2110). Then central portions of the silicon nitride material 360 and the silicon oxide material 350 are masked and the non-central portions not under the mask are etched away down to the NSEG base 340 (step 2115).

Then a self aligned base implantation process is performed on the NSEG base 340 (step 2120). Then an oxide layer 1810 is deposited over the silicon nitride 360 and over the NSEG base 340 using a Physical Vapor Deposition (PVD) process (step 2125). Then the oxide layer 1810 is etched away from the sides of the silicon nitride 360 and then the sacrificial silicon nitride emitter 360 is etched away (step 2130).

Then the silicon oxide material 350 at the bottom of the emitter window is etched away and an oxide spacer layer 1010 is deposited (step 2135). Then polysilicon spacers 1110 are formed on the sides of the emitter window and on top of the oxide spacer layer 1010 (step 2140). Then portions of the oxide spacer layer 1010 that are not covered by the polysilicon spacers 1110 are etched away to expose the underlying NSEG base 340 (step 2145).

Then a polysilicon layer 1310 is deposited to form a polysilicon emitter (step 2150). Then the central portion of the polysilicon layer 1310 is masked and the portions of the polysilicon layer 1310 and the portions of the oxide layer 1810 that are not under the mask are etched away (step 2155).

Then a polybase mask is used to mask central portions of the polysilicon layer 1310 and portions of the NSEG base 340 that are adjacent to the emitter window (step 2160). Then portions of the NSEG base 340 that are not under the polybase mask are etched away. The etch process stops on the underlying shallow trench isolation (STI) structures 330 (step 2165).

The second embodiment of the method provides an alternative to selectively growing an extrinsic base as is done in the first embodiment of the method. The second embodiment of the method reduces the process complexity of EPI growth at the expense of using an external base implantation step.

The system and method of the present invention provides several significant advantages. The present invention removes the need to perform a Chemical Mechanical Polishing (CMP) procedure to planarize the topology of a sacrificial nitride emitter. This solves the prior art problem of compatibility with BiCMOS technology.

The first embodiment of the method provides a simple process that provides a non-selective growth EPI base, no CMP procedure for the sacrificial silicon nitride emitter, and no external base implant. The second embodiment of the method provides a simple process that provides a non-selective growth EPI base, no CMP procedure for the sacrificial silicon nitride emitter, and reduced process complexity of EPI growth at the expense of using an external base implantation step.

The system and method of the present invention provides an efficient self aligned emitter-base structure that has low levels of parasitic capacitances and parasitic resistances. The system and method of the present invention also provides a high level of radio frequency (RF) performance.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned bipolar transistor comprising the steps of:
   forming an active region of the transistor;
   forming a silicon nitride sacrificial emitter above the active region of the transistor;
   depositing a physical vapor deposition oxide layer over the silicon nitride sacrificial emitter using a physical vapor deposition process;
   exposing a top of the silicon nitride sacrificial emitter without performing a chemical mechanical polishing process;
   performing a hot phosphoric acid etch process to remove the silicon nitride sacrificial emitter and create an emitter window;
   depositing an oxide spacer layer over vertical side walls and a bottom of the emitter window;
   forming polysilicon spacers over vertical side walls and portions of a bottom of the oxide spacer layer in the emitter window; and
   performing a second etch process to remove a portion of the bottom of the oxide spacer layer that is not covered by the polysilicon spacers to expose an underlying base portion of the transistor.

2. The method as claimed in claim 1 wherein a thickness of the physical vapor deposition oxide layer over side walls of the silicon nitride sacrificial emitter is at most fifteen nanometers.

3. The method as claimed in claim 1 wherein the physical vapor deposition process deposits the physical vapor deposition oxide layer anisotropically.

4. The method as claimed in claim 1 further comprising the step of:
   performing a third etch process to remove portions of the physical vapor deposition oxide layer from side walls of the silicon nitride sacrificial emitter.

5. The method as claimed in claim 4 wherein the third etch process comprises an isotropic wet etch process.

6. The method as claimed in claim 4 further comprising the steps of:
   performing a diluted hydrofluoric acid etch process to open the emitter window to the active region of the transistor; and
   forming an emitter structure in the emitter window.

7. A method of manufacturing a self aligned bipolar transistor comprising the steps of:
   forming an active region of the transistor that comprises a collector portion covered by a base portion covered by a silicon oxide material;
   forming a silicon nitride sacrificial emitter on the silicon oxide material above the active region of the transistor;
   removing portions of the silicon oxide material that are not under the silicon nitride sacrificial emitter;
   growing an in-situ layer of silicon/polysilicon on an external base region of the base portion of the transistor;
   depositing a physical vapor deposition oxide layer over the silicon nitride sacrificial emitter and over the layer of silicon/polysilicon using a physical vapor deposition process;
   exposing a top of the silicon nitride sacrificial emitter without performing a chemical mechanical polishing process;
   performing a hot phosphoric acid etch process to remove the silicon nitride sacrificial emitter and create an emitter window;

depositing an oxide spacer layer over vertical side walls and a bottom of the emitter window;

forming polysilicon spacers over vertical side walls and portions of a bottom of the oxide spacer layer in the emitter window; and performing a second etch process to remove a portion of the bottom of the oxide spacer layer that is not covered by the polysilicon spacers to expose the underlying base portion of the transistor.

8. The method as claimed in claim 7 wherein a thickness of the physical vapor deposition oxide layer over side walls of the silicon nitride sacrificial emitter is at most fifteen nanometers.

9. The method as claimed in claim 7 further comprising the steps of:

performing a third etch process to remove portions of the physical vapor deposition oxide layer from side walls of the silicon nitride sacrificial emitter.

10. The method as claimed in claim 9 further comprising the steps of:

performing a diluted hydrofluoric acid etch process to remove portions of the silicon oxide material to open the emitter window to the base region of the transistor; and forming an emitter structure in the emitter window.

11. The method as claimed in claim 7 wherein the oxide spacer layer comprises a tetraethyloxysilane layer having a thickness of approximately twenty nanometers.

12. The method as claimed in claim 10 wherein the step of forming the emitter structure in the emitter window comprises the steps of:

depositing a polysilicon layer to form a polysilicon emitter in the emitter window;

masking a central portion on the polysilicon layer; and performing a fifth etch process to remove portions of the polysilicon layer and portions of the physical vapor deposition oxide layer that are not located under the mask.

13. The method as claimed in claim 12 wherein the step of forming the emitter structure in the emitter window further comprises the steps of:

masking with a polybase mask the central portion of the polysilicon layer and portions of the silicon/polysilicon layer that are adjacent to the emitter window; and performing a sixth etch process to remove portions of the silicon/polysilicon layer and portions of the base portion of the transistor that are not under the polybase mask.

14. A method of manufacturing a self aligned bipolar transistor comprising the steps of:

forming an active region of the transistor that comprises a collector portion covered by a base portion covered by a silicon oxide material;

forming a silicon nitride sacrificial emitter on the silicon oxide material above the active region of the transistor;

removing portions of the silicon oxide material that are not under the silicon nitride sacrificial emitter;

performing a self aligned base implantation process on an external base region of the base portion of the transistor;

depositing a physical vapor deposition oxide layer over the silicon nitride sacrificial emitter using a physical vapor deposition process;

exposing a top of the silicon nitride sacrificial emitter without performing a chemical mechanical polishing process;

performing a hot phosphoric acid etch process to remove the silicon nitride sacrificial emitter and create an emitter window;

depositing an oxide spacer layer over vertical side walls and a bottom of the emitter window;

forming polysilicon spacers over vertical side walls and portions of a bottom of the oxide spacer layer in the emitter window; and performing a second etch process to remove a portion of the bottom of the oxide spacer layer that is not covered by the polysilicon spacers to expose the underlying base portion of the transistor.

15. The method as claimed in claim 14 wherein a thickness of the physical vapor deposition oxide layer over side walls of the silicon nitride sacrificial emitter is at most fifteen nanometers.

16. The method as claimed in claim 14 further comprising the steps of:

performing a third etch process to remove portions of the physical vapor deposition oxide layer from side walls of the silicon nitride sacrificial emitter.

17. The method as claimed in claim 16 further comprising the steps of:

performing a diluted hydrofluoric acid etch process to remove portions of the silicon oxide material to open the emitter window to the base region of the transistor; and forming an emitter structure in the emitter window.

18. The method as claimed in claim 14 wherein the oxide spacer layer comprises a tetraethyloxysilane layer having a thickness of approximately twenty nanometers.

19. The method as claimed in claim 17 wherein the step of forming the emitter structure in the emitter window comprises the steps of:

depositing a polysilicon layer to form a polysilicon emitter in the emitter window;

masking a central portion on the polysilicon layer; and performing a fifth etch process to remove portions of the polysilicon layer and portions of the physical vapor deposition oxide layer that are not located under the mask.

20. The method as claimed in claim 19 wherein the step of forming the emitter structure in the emitter window further comprises the steps of:

masking with a polybase mask the central portion of the polysilicon layer and portions of the base portion of the transistor that are adjacent to the emitter window; and performing a sixth etch process to remove portions of the base portion of the transistor that are not under the polybase mask.

* * * * *